United States Patent
Park et al.

(10) Patent No.: US 11,615,822 B2
(45) Date of Patent: Mar. 28, 2023

(54) ELECTRONIC DEVICE AND ELECTRONIC SYSTEM RELATED TO PERFORMANCE OF A TERMINATION OPERATION

(71) Applicant: SK hynix Inc., Icheon-si (KR)

(72) Inventors: Min Su Park, Icheon-si (KR); Seung Wook Oh, Icheon-si (KR); Jin Il Chung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 45 days.

(21) Appl. No.: 17/499,384

(22) Filed: Oct. 12, 2021

(65) Prior Publication Data
US 2022/0343955 A1 Oct. 27, 2022

(30) Foreign Application Priority Data
Apr. 23, 2021 (KR) .................. 10-2021-0053347

(51) Int. Cl.
*G11C 7/10* (2006.01)

(52) U.S. Cl.
CPC .......... *G11C 7/1048* (2013.01); *G11C 7/1093* (2013.01); *G11C 2207/2272* (2013.01)

(58) Field of Classification Search
CPC ................ G11C 7/1048; G11C 7/1093; G11C 2207/2272
USPC ...................................... 365/189.16
See application file for complete search history.

(56) References Cited

U.S. PATENT DOCUMENTS

| | | | |
|---|---|---|---|
| 8,274,850 B2 * | 9/2012 | Koshizuka | G11C 5/06 365/191 |
| 8,988,952 B2 * | 3/2015 | Hiraishi | G11C 7/222 365/194 |
| 10,541,018 B2 * | 1/2020 | McCall | G11C 7/1066 |
| 10,680,613 B2 | 6/2020 | Bains et al. | |

FOREIGN PATENT DOCUMENTS

KR 1020180015949 A 2/2018

* cited by examiner

*Primary Examiner* — Son L Mai
(74) *Attorney, Agent, or Firm* — William Park & Associates Ltd.

(57) ABSTRACT

An electronic device includes an enable signal generation circuit configured to activate, when a write operation is performed, a termination enable signal earlier than a time point when a write latency elapses, by a duration amount of an entry offset period; and a data input and output circuit configured to receive, when the write operation is performed, data later than the time point when the write latency elapses, based on the termination enable signal, wherein the data input and output circuit receives the data after the write latency elapses by a duration amount of a first data reception delay period.

20 Claims, 16 Drawing Sheets

FIG. 6

| RANK1 INFO | |
|---|---|
| TD1 | td11 |
| SRD1 | td12 |
| SD1 | td13 |
| STD1 | td11 + td12 |
| DTD1 | td11 + td12 + td13 |
| DRD1 | td12 + td13 |

| RANK2 INFO | |
|---|---|
| TD2 | td21 |
| SRD2 | td22 |
| SD2 | td23 |
| STD2 | td21 + td22 |
| DTD2 | td21 + td22 + td23 |
| DRD2 | td22 + td23 |

FIG. 8

| DRD1 | ODT_ON1 |
|---|---|
| 0tCK ≤ td12 + td13 < 0.05tCK | 2tCK |
| 0.05tCK ≤ td12 + td13 < 1.05tCK | 1tCK |
| 1.05tCK ≤ td12 + td13 < 2.05tCK | 0tCK |

| DRD2 | ODT_ON2 |
|---|---|
| 0tCK ≤ td22 + td23 < 0.05tCK | 2tCK |
| 0.05tCK ≤ td22 + td23 < 1.05tCK | 1tCK |
| 1.05tCK ≤ td22 + td23 < 2.05tCK | 0tCK |

| DRD1 | ODT_OFF1 |
|---|---|
| 0tCK ≤ td12 + td13 < 0.45tCK | 0tCK |
| 0.45tCK ≤ td12 + td13 < 1.45tCK | 1tCK |
| 1.45tCK ≤ td12 + td13 < 2.45tCK | 2tCK |

| DRD2 | ODT_OFF2 |
|---|---|
| 0tCK ≤ td22 + td23 < 0.45tCK | 0tCK |
| 0.45tCK ≤ td22 + td23 < 1.45tCK | 1tCK |
| 1.45tCK ≤ td22 + td23 < 2.45tCK | 2tCK |

ELECTRONIC DEVICE AND ELECTRONIC SYSTEM RELATED TO PERFORMANCE OF A TERMINATION OPERATION

CROSS-REFERENCE TO RELATED APPLICATION

The present application claims priority under 35 U.S.C. § 119(a) to Korean application number 10-2021-0053347, filed in the Korean Intellectual Property Office on Apr. 23, 2021, the entire disclosure of which is incorporated herein by reference in its entirety.

BACKGROUND

1. Technical Field

Embodiments of the present disclosure relate to an electronic device and an electronic system related to performing a termination operation.

2. Related Art

In a semiconductor device, an impedance mismatch phenomenon occurs in an operation of transmitting and receiving signals at high speed. In order to solve this problem, the semiconductor device may perform a termination operation of matching external and internal impedances. Recently, the semiconductor device has increased signal integrity by adjusting the impedance of a non-target rank as well as the impedance of a target rank in performing an inter-rank internal operation.

SUMMARY

In an embodiment, an electronic device may include: an enable signal generation circuit configured to activate, when a write operation is performed, a termination enable signal earlier than a time point when a write latency elapses, by a duration amount of an entry offset period; and a data input and output circuit configured to receive, when the write operation is performed, data later than the time point when the write latency elapses, based on the termination enable signal, wherein the data input and output circuit receives the data after the write latency elapses by a duration amount of a first data reception delay period, wherein the entry offset period is adjusted depending on the first data reception delay period.

In an embodiment, an electronic device may include: a first rank including a first termination resistor, and configured to, when performing a write operation, receive data later than a time point when a write latency elapses, by a duration amount of a first data reception delay period; and a second rank including a second termination resistor, and configured to, when the first rank performs the write operation, adjust a value of the second termination resistor earlier than the time point when the write latency elapses, by a duration amount of a non-target entry offset period, wherein the non-target entry offset period is adjusted depending on the first data reception delay period.

In an embodiment, an electronic system may include: a controller configured to transmit a command for a write operation, data and an offset information; and a memory device including first and second ranks which receive the command, the data and the offset information, each of the first and second ranks being set as one of a target rank which performs the write operation and a non-target rank, wherein the controller adjusts a time point when the data is transmitted, depending on which one of the first and second ranks is the target rank, wherein the memory device sets periods by which values of a termination resistor of the target rank and a termination resistor of the non-target rank are adjusted, to be the same, based on the offset information, and wherein the offset information is generated based on information on a time point when the target rank receives the data.

BRIEF DESCRIPTION OF THE DRAWINGS

FIG. 6 is a table for explaining the generation of information in the first rank information generation circuit illustrated in FIG. 3 and the second rank information generation circuit illustrated in FIG. 5.

FIG. 8 is a table for explaining operations of first and second offset information generation circuits illustrated in FIG. 2.

DETAILED DESCRIPTION

In the following descriptions of embodiments, the term "preset" indicates that the numerical value of a parameter is previously deckled, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described through embodiments. The embodiments are only used to provide examples of the teachings of the present disclosure, and the scope of the present disclosure is not limited by the embodiments.

Various embodiments are directed to an electronic device and an electronic system performing a termination operation.

According to the present disclosure, by adjusting an offset period that determines an entry (end) time point of a termination operation, depending on a period by which data reception is delayed from a reference time point in a write operation, it may be possible to optimize a period in which the termination operation is performed.

Also, according to the present disclosure, by setting an offset period of a non-target rank depending on a data reception delay period of a target rank performing a write operation, it may be possible to optimize a period in which a termination operation is performed in a write operation alternately performed between ranks.

Figure 1:
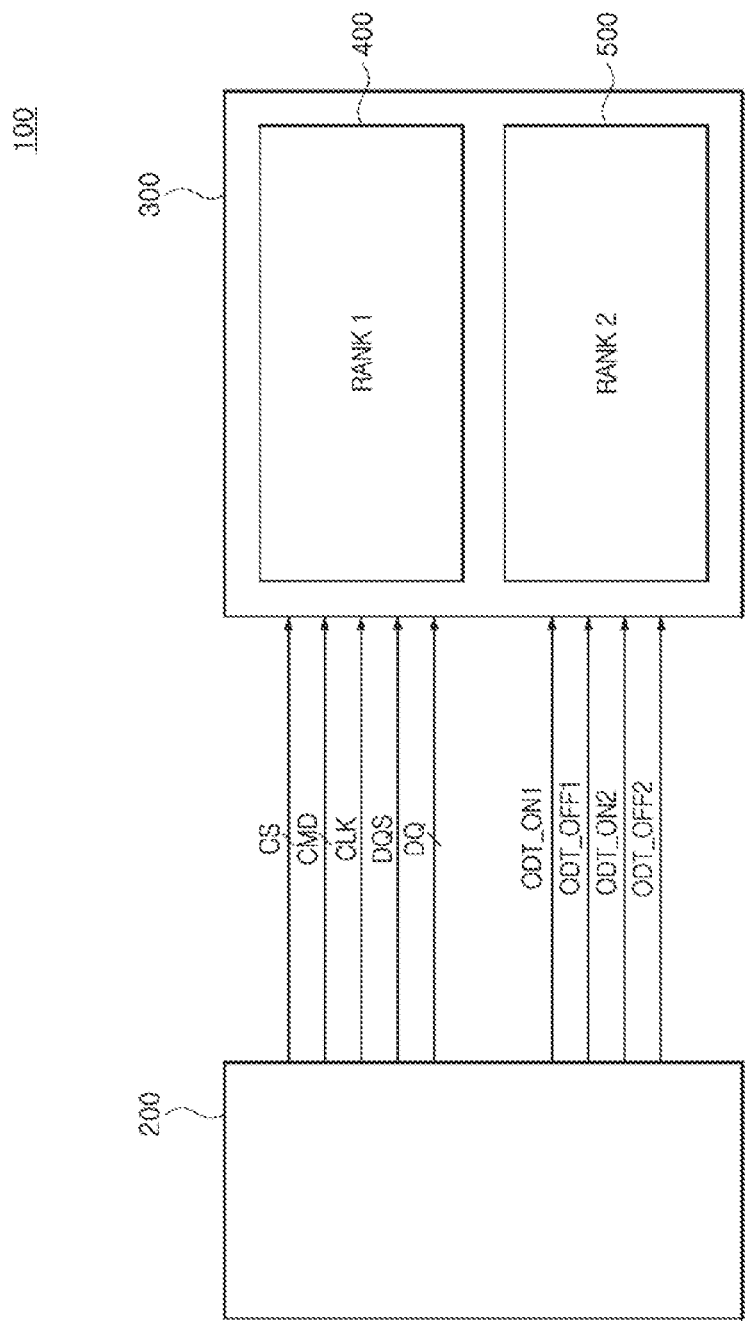
FIG. 1 is a block diagram illustrating a configuration of an electronic system in accordance with an embodiment of the present disclosure.

FIG. 1 is a block diagram illustrating a configuration of an electronic system 100 in accordance with an embodiment of the present disclosure. As illustrated in FIG. 1, the electronic system 100 may include a first electronic device 200 and a second electronic device 300. The first electronic device 200 may be implemented by a controller. The second electronic device 300 may be implemented by a memory device. The second electronic device 300 may include a third electronic device (hereinafter, referred to as a first rank) 400 and a fourth electronic device (hereinafter, referred to as a second rank) 500.

The first electronic device 200 may transmit a command CMD and a chip select signal CS to the second electronic device 300. The first electronic device 200 may transmit the command CMD for various operations including a write operation and a mode register write operation to the second electronic device 300. The first electronic device 200 may transmit the chip select signal CS together with the command CMD. For example, a first chip select signal may constitute the chip select signal CS, and the first electronic device 200 may activate the first chip select signal CS1 to set the first rank 400 as a target rank which performs a write operation based on the command CMD. In this case, the second rank 500 may be set as a non-target rank. For example, a second chip select signal CS2 may constitute the chip select signal CS, and the first electronic device 200 may activate the second chip select signal CS2 to set the second rank 500 as a target rank which performs a write operation based on the command CMD. In this case, the first rank 400 may be set as a non-target rank. The first chip select signal CS1 and the second chip select signal CS2 may be selectively activated.

The first electronic device 200 may transmit a clock CLK, a strobe signal DQS and data DQ to the second electronic device 300. When transmitting the command CMD and the chip select signal CS for a write operation in the first rank 400, the first electronic device 200 may transmit the strobe signal DQS to the second electronic device 300 after a time point when a write latency elapses. The first electronic device 200 may delay transmission of the strobe signal DQS to the second electronic device 300 by a first strobe transmission delay period after or later than the time point after the write latency elapses. In an embodiment, the first electronic device 200 delay transmission of the strobe signal DQS to the second electronic device 300 by a first strobe transmission delay period so that when transmitting the command CMD and the chip select signal CS for a write operation in the first rank 400, the first electronic device 200 may transmit the strobe signal DQS to the second electronic device 300 later than the time point when the write latency elapses (i.e., see write latency tWL of FIG. 9), by a duration amount of a first strobe transmission delay period (i.e., see td11+td12 of FIG. 9). The first strobe transmission delay period may be set as a period that is obtained by summing a first transmission delay period and a first strobe reception delay period (i.e., see td11+td12 of FIG. 9). The first transmission delay period may be set as a period for compensating for skews of the clock CLK and the strobe signal DQS between the first electronic device 200 and the first rank 400. The first strobe reception delay period may be set as a period for compensating for a phase difference between an internal clock ICLK1 (see FIG. 10) and an internal strobe signal IDQS1 (see FIG. 10) in the first rank 400. When transmitting the command CMD and the chip select signal CS for the write operation in the first rank 400, the first electronic device 200 may transmit the data DQ to the second electronic device 300 after a time point when the write latency elapses. The first electronic device 200 may delay transmission of the data DQ to the second electronic device 300 by a first data transmission delay period after or later than the time point after the write latency elapses. In an embodiment, the first electronic device 200 may delay transmission of the data DQ to the second electronic device 300 by a first data transmission delay period so that when transmitting the command CMD and the chip select signal CS for the write operation in the first rank 400, the first electronic device 200 may transmit the data DQ to the second electronic device 300 later than the time point when the write latency elapses, by a duration amount of a first data transmission delay period. The first data transmission delay period may be set as a period that is obtained by summing the first transmission delay period and a first data reception delay period. The first data reception delay period may include the first strobe reception delay period and a first strobing delay period. The first strobing delay period may be set as a period for compensating for a time required for the internal strobe signal IDQS1 (see FIG. 10) to strobe the internal data ID1 (see FIG. 10) in the first rank 400.

When transmitting the command CMD and the chip select signal CS for a write operation in the second rank 500, the first electronic device 200 may transmit the strobe signal DQS to the second electronic device 300 after a time point when a write latency elapses. The first electronic device 200 may delay transmission of the strobe signal DQS to the second electronic device 300 by a second strobe transmission delay period after or later than the time point after a write latency elapses. In an embodiment, the first electronic device 200 may delay transmission of the strobe signal DQS to the second electronic device 300 by a second strobe transmission delay period so that when transmitting the command CMD and the chip select signal CS for a write operation in the second rank 500, the first electronic device 200 may transmit the strobe signal DQS to the second electronic device 300 later than the time point when a write latency elapses, by a duration amount of a second strobe transmission delay period. When transmitting the command CMD and the chip select signal CS for the write operation in the second rank 500, the first electronic device 200 may transmit the data DQ to the second electronic device 300 after the a time point when the write latency elapses. The first electronic device 200 may delay transmission of the data DQ to the second electronic device 300 by a second data transmission delay period after or later than the time point after the write latency elapses. In an embodiment, the first electronic device 200 may delay transmission of the data DQ to the second electronic device 300 by a second data transmission delay period so that when transmitting the command CMD and the chip select signal CS for the write operation in the second rank 500, the first electronic device 200 may transmit the data DQ to the second electronic device 300 later than the time point when the write latency elapses, by a duration amount of a second data transmission delay period. The second strobe transmission delay period and the second data transmission delay period may be set differently from the first strobe transmission delay period and the first data transmission delay period, respectively, depending on a rank characteristic. That is to say, the first electronic device 200 may adjust time points at which the strobe signal DQS and the data DQ are transmitted, depending on which one of the first rank 400 and the second rank 500 is a target rank.

The first electronic device 200 may transmit a first entry offset information ODT_ON1, a first end offset information ODT_OFF1, a second entry offset information ODT_ON2 and a second end offset information ODT_OFF2 to the second electronic device 300 through command address lines (not illustrated). Each of the command address lines may be set as a line through which at least one of the command CMD and an address (not illustrated) is transmitted. When transmitting the command CMD for a mode register write operation, the first electronic device 200 may transmit at least one of the first entry offset information ODT_ON1, the first end offset information ODT_OFF1, the second entry offset information ODT_ON2 and the second end offset information ODT_OFF2 to the second electronic device 300. The first entry offset information ODT_ON1 and the first end offset information ODT_OFF1 may be generated based on information on the first data reception delay period of the first rank 400. In other words, the first entry offset information ODT_ON1 and the first end offset information ODT_OFF1 may be generated based on information on a time point at which the first rank 400 receives the data DQ. The second entry offset information ODT_ON2 and the second end offset information ODT_OFF2 may be generated based on information on a second data reception delay period of the second rank 500. In other words, the second entry offset information ODT_ON2 and the second end offset information ODT_OFF2 may be generated based on information on a time point at which the second rank 500 receives the data DQ. A configuration and operation of the first electronic device 200 will be described later with reference to FIG. 2.

The second electronic device 300 may include the first rank (RANK 1) 400 and the second rank (RANK 2) 500, The first rank 400 and the second rank 500 may receive the first chip select signal CS1 and the second chip select signal CS2, respectively. The first rank 400 and the second rank 500 may share signal lines through which the command CMD, the clock CLK, the strobe signal DQS, the data DQ, the first entry offset information ODT_ON1, the first end offset information ODT_OFF1, the second entry offset information ODT_ON2 and the second end offset information ODT_OFF2 are transmitted.

When performing the write operation, the first rank 400 may receive the strobe signal DQS later than the time point when the write latency elapses, by the duration amount of the first strobe reception delay period. When performing the write operation, the first rank 400 may receive the data DQ later than the time point when the write latency elapses, by the duration amount of the first data reception delay period. When performing the write operation, the second rank 500 may receive the strobe signal DQS later than the time point when the write latency elapses, by the duration amount of the second strobe reception delay period. When performing the write operation, the second rank 500 may receive the data DQ later than the time point when the write latency elapses, by the duration amount of the second data reception delay period.

When performing the mode register rite operation, the first rank 400 may receive and store the first entry offset information ODT_ON1 and the first end offset information ODT_OFF1 generated based on the information on the first data reception delay period. The first rank 400 may include a first termination resistor RTT_R1. When being set as a target rank for performing the write operation, the first rank 400 may receive the data DQ by adjusting a value of the first termination resistor RTT_R1. When performing the write operation, the first rank 400 may adjust a value of the first termination resistor RTT_R1 from a first resistance value RTT_PARK to a second resistance value RTT_WR earlier, by an entry offset period of the first rank 400, than the time point when the write latency elapses, based on the first entry offset information ODT_ON1. The entry offset period of the first rank 400 may be adjusted depending on the first data reception delay period. In more detail, the entry offset period of the first rank 400 may decrease as the first data reception delay period increases. When performing the write operation, the first rank 400 may adjust a value of the first termination resistor RTT_R1 from the second resistance value RTT_WR to the first resistance value RTT_PARK later than a time point when the write latency and a burst length period elapse, by a duration amount of an end offset period of the first rank 400, based on the first end offset information ODT_OFF1. The end offset period of the first rank 400 may be adjusted depending on the first data reception delay period. In more detail, the end offset period of the first rank 400 may increase as the first data reception delay period increases.

When performing the mode register write operation, the first rank 400 may receive and store the second entry offset information ODT_ON2 and the second end offset information ODT_OFF2 generated based on the information on the second data reception delay period of the second rank 500. When being set as a non-target rank, the first rank 400 may adjust a value of the first termination resistor RTT_R1, and may block the reception of the data DQ. When performing the write operation, the first rank 400 may adjust a value of the first termination resistor RTT_R1 from the first resistance value RTT_PARK to a third resistance value RTF_NOM earlier, by a non-target entry offset period of the first rank 400, than the time point when the write latency elapses, based on the second entry offset information ODT_ON2. The non-target entry offset period of the first rank 400 may be adjusted depending on the second data reception delay period. In more detail, the non-target entry offset period of the first rank 400 may decrease as the second data reception delay period increases. When performing the write operation, the first rank 400 may adjust a value of the first termination resistor RTT_R1 from the third resistance value RTT_NOM to the first resistance value RTT_PARK later than the time point when the write latency and the burst length period elapse, by a duration amount of a non-target end offset period of the first rank 400, based on the second end offset information ODT_OFF2. The non-target end offset period of the first rank 400 may be adjusted depending on the second data reception delay period. In more detail, the non-target end offset period of the first rank 400 may increase as the second data reception delay period increases. The configuration and operation of the first rank 400 will be described later with reference to FIG. 10.

When performing the mode register write operation, the second rank 500 may receive and store the second entry offset information ODT_ON2 and the second end offset information ODT_OFF2 generated based on the information on the second data reception delay period. The second rank 500 may include a second termination resistor RTT_R2. When being set as a target rank for performing the write operation, the second rank 500 may receive the data DQ by adjusting a value of the second termination resistor RTT_R2. When performing the write operation, the second rank 500 may adjust a value of the second termination resistor RTT_R2 from the first resistance value RTT_PARK to the second resistance value RTT_WR earlier, by an entry offset period of the second rank 500, than the time point when the write latency elapses, based on the second entry offset information ODT_ON2. The entry offset period of the second rank 500 may be adjusted depending on the second data reception delay period. In more detail, the entry offset period of the second rank 500 may decrease as the second data reception delay period increases. The entry offset period of the second rank 500 may be set to be the same as the non-target entry offset period of the first rank 400. When performing the write operation, the second rank 500 may adjust a value of the second termination resistor RTT_R2 from the second resistance value RTT_WR to the first resistance value RTT_PARK later than a time point when the write latency and a burst length period elapse, by a duration amount of an end offset period of the second rank 500, based on the second end offset information ODT_OFF2. The end offset period of the second rank 500 may be adjusted depending on the second data reception delay period. In more detail, the end offset period of the second rank 500 may increase as the second data reception delay period increases. The end offset period of the second rank 500 may be set to be the same as the non-target end offset period of the first rank 400.

When performing the mode register write operation, the second rank 500 may receive and store the first entry offset information ODT_ON1 and the first end offset information ODT_OFF1 generated based on the information on the first data reception delay period of the first rank 400. When being set as a non-target rank, the second rank 500 may adjust a value of the second termination resistor RTT_R2, and may block the reception of the data DQ. When performing the write operation, the second rank 500 may adjust a value of the second termination resistor RTT_R2 from the first resistance value RTT_PARK to the third resistance value RTT_NOM earlier, by a non-target entry offset period of the second rank 500, than the time point when the write latency elapses, based on the first entry offset information ODT_ON1. The non-target entry offset period of the second rank 500 may be adjusted depending on the first data reception delay period. In more detail, the non-target entry offset period of the second rank 500 may decrease as the first data reception delay period increases. The non-target entry offset period of the second rank 500 may be set to be the same as the entry offset period of the first rank 400. When performing the write operation, the second rank 500 may adjust a value of the second termination resistor RTT_R2 from the third resistance value RTT_NOM to the first resistance value RTT_PARK later than the time point when the write latency and the burst length period elapse, by a duration amount of a non-target end offset period of the second rank 500, based on the first end offset information ODT_OFF1. The non-target end offset period of the second rank 500 may be adjusted depending on the first data reception delay period. In more detail, the non-target end offset period of the second rank 500 may increase as the first data reception delay period increases. The non-target end offset period of the second rank 500 may be set to be the same as the end offset period of the first rank 400. Accordingly, when being set as a non-target rank, the second rank 500 may set periods by which values of the first termination resistor RTT_R1 and the second termination resistor RTT_R2 are adjusted, to be same, based on the first entry offset information ODT_ON1 and the first end offset information ODT_OFF1, The configuration and operation of the second rank 500 will be described later with reference to FIG. 15.

Figure 2:
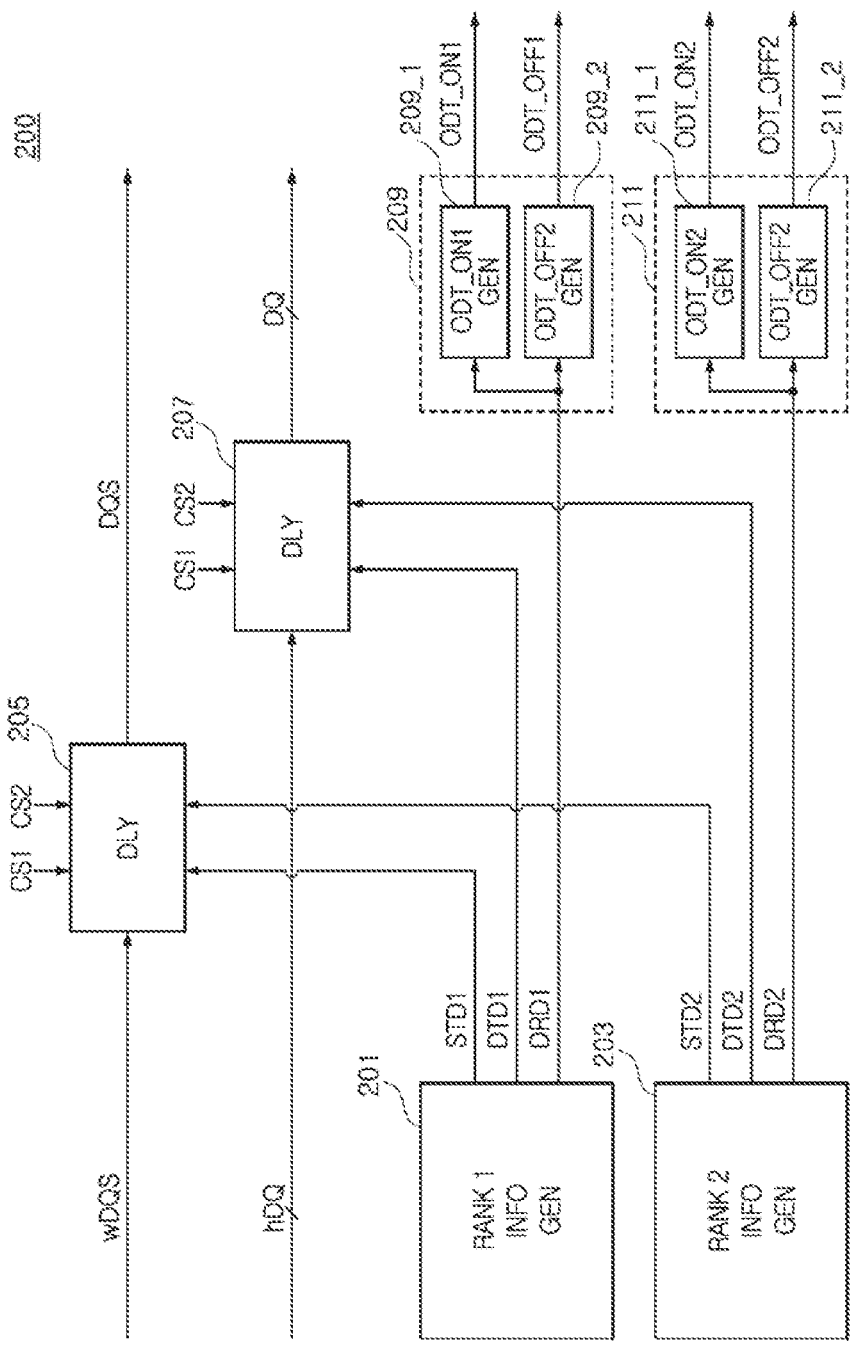
FIG. 2 is a block diagram illustrating a configuration of an embodiment of a first electronic device illustrated in FIG. 1.

FIG. 2 is a block diagram illustrating a configuration of an embodiment of the first electronic device 200 illustrated in FIG. 1. As illustrated in FIG. 2, the first electronic device 200 may include a first rank information generation circuit (RANK1 INFO GEN) 201, a second rank information generation circuit (RANK2 INFO GEN) 203, a first delay circuit (DLY) 205, a second delay circuit (DLY) 207, a first offset information generation circuit 209 and a second offset information generation circuit 211. Description for operations and configurations in which the first electronic device 200 illustrated in FIG. 1 outputs the chip select signal CS, the clock CLK and the command CMD will be omitted herein.

The first rank information generation circuit 201 may generate first strobe transmission delay information STD1, first data transmission delay information DTD1 and first data reception delay information DRD1. The first strobe transmission delay information STD1 may be set as information on the first strobe transmission delay period of the first rank 400 (see FIG. 1), The first data transmission delay information DTD1 may be set as information on the first data transmission delay period of the first rank 400, The first data reception delay information DRD1 may be set as information on the first data reception delay period of the first rank 400. The configuration and operation of the first rank information generation circuit 201 will be described later with reference to FIGS. 3 and 4.

The second rank information generation circuit 203 may generate second strobe transmission delay information STD2, second data transmission delay information DTD2 and second data reception delay information DRD2, The second strobe transmission delay information STD2 may be set as information on the second strobe transmission delay period of the second rank 500 (see FIG. 1). The second data transmission delay information DTD2 may be set as information on the second data transmission delay period of the second rank 500. The second data reception delay information DRD2 may be set as information on the second data reception delay period of the second rank 500. The configuration and operation of the second rank information generation circuit 203 will be described later with reference to FIG. 5.

The first delay circuit 205 may delay a write strobe signal wDQS by the first strobe transmission delay period based on the first strobe transmission delay information STD1 when the first chip select signal CS1 is activated, and thereby, may output the delayed write strobe signal wDQS as the strobe signal DQS. The first delay circuit 205 may delay the write strobe signal wDQS by the second strobe transmission delay period based on the second strobe transmission delay information STD2 when the second chip select signal CS2 is activated, and thereby, may output the delayed write strobe signal wDQS as the strobe signal DQS. The write strobe signal wDQS may be generated when the command CMD (see FIG. 1) for a write operation is transmitted to the second electronic device 300 (see FIG. 1).

The second delay circuit 207 may delay host data hDQ by the first data transmission delay period based on the first data transmission delay information DTD1 when the first chip select signal CS1 is activated, and thereby, may output the delayed host data hDQ as the data DQ. The second delay circuit 207 may delay the host data hDQ by the second data transmission delay period based on the second data transmission delay information DTD2 when the second chip select signal CS2 is activated, and thereby, may output the delayed host data hDQ as the data DQ. The host data hDQ may be generated when the command CMD (see FIG. 1) for a write operation is transmitted to the second electronic device 300 (see FIG. 1).

The first offset information generation circuit 209 may include a first entry offset information generation circuit 209_1 and a first end offset information generation circuit 209_2. The first entry offset information generation circuit 209_1 may generate the first entry offset information ODT_ON1 based on the first data reception delay information DRD1 on the first data reception delay period. The first entry offset information ODT_ON1 may be generated to set the entry offset period of the first rank 400 (see FIG. 1) and the non-target entry offset period of the second rank 500 (see FIG. 1). The first end offset information generation circuit 209_2 may generate the first end offset information ODT_OFF1 based on the first data reception delay information DRD1 on the first data reception delay period. The first end offset information ODT_OFF1 may be generated to set the end offset period of the first rank 400 and the non-target end offset period of the second rank 500.

The second offset information generation circuit 211 may include a second entry offset information generation circuit 211_1 and a second end offset information generation circuit 211_2. The second entry offset information generation circuit 211_1 may generate the second entry offset information ODT_ON2 based on the second data reception delay information DRD2 on the second data reception delay period. The second entry offset information ODT_ON2 may be generated to set the non-target entry offset period of the first rank 400 (see FIG. 1) and the entry offset period of the second rank 500 (see FIG. 1). The second end offset information generation circuit 211_2 may generate the second end offset information ODT_OFF2 based on the second data reception delay information DRD2 on the second data reception delay period. The second end offset information ODT_OFF2 may be generated to set the non-target end offset period of the first rank 400 and the end offset period of the second rank 500, The operations of the first offset information generation circuit 209 and the second offset information generation circuit 211 will be described later with reference to FIG. 8.

Figure 3:
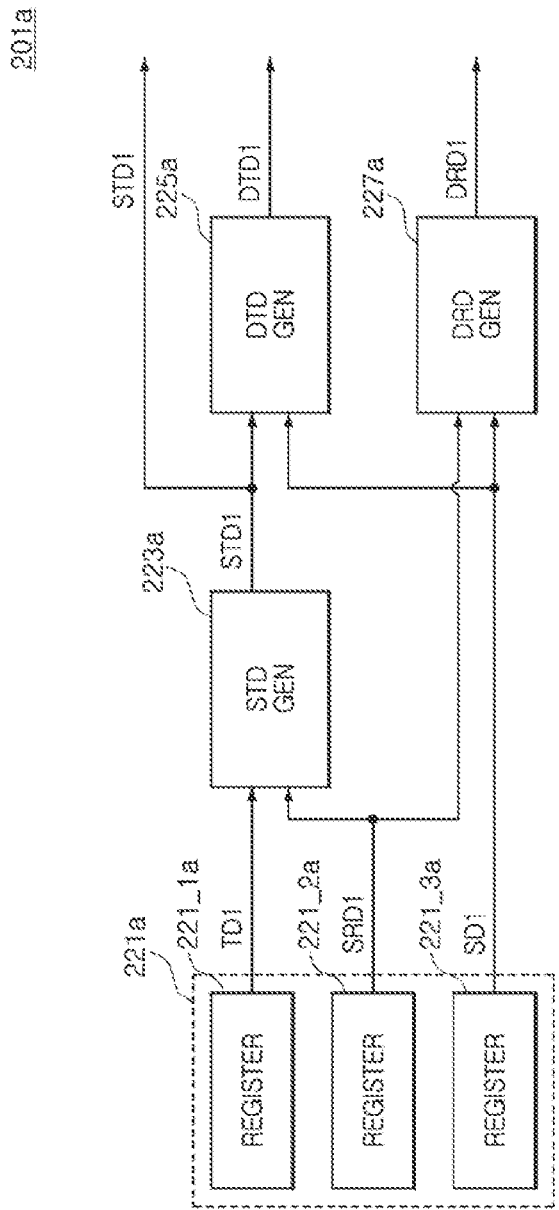
FIG. 3 is a block diagram illustrating a configuration of an embodiment of a first rank information generation circuit illustrated in FIG. 2.

FIG. 3 is a block diagram illustrating a configuration of an embodiment 201a of the first rank information generation circuit 201 illustrated in FIG. 2. As illustrated in FIG. 3, the first rank information generation circuit 201a may include a first rank information storage circuit 221a, a first strobe transmission delay information generation circuit (STD GEN) 223a, a first data transmission delay information generation circuit (DTD GEN) 225a and a first data reception delay information generation circuit (DRD GEN) 227a.

The first rank information storage circuit 221a may include registers 221_1a, 221_2a and 221_3a. The register 221_1a may store and output a first transmission delay information TD1 in a write training. The first transmission delay information TD1 may be set as information on the first transmission delay period. The register 221_2a may store and output a first strobe reception delay information SRD1 in the write training. The first strobe reception delay information SRD1 may be set as information on the first strobe reception delay period. The register 221_3a may store and output a first strobing delay information SD1 in the write training. The first strobing delay information SD1 may be set as information on the first strobing delay period, Operations in which the first rank information storage circuit 221a stores delay information in a write training will be described later with reference to FIG. 8.

The first strobe transmission delay information generation circuit 223a may generate the first strobe transmission delay information STD1, set as information on the first strobe transmission delay period, based on the first transmission delay information TD1 and the first strobe reception delay information SRD1, The first strobe transmission delay period may be set as a period that is obtained by summing the first transmission delay period and the first strobe reception delay period.

The first data transmission delay information generation circuit 225a may generate the first data transmission delay information DTD1, set as information on the first data transmission delay period, based on the first strobe transmission delay information STD1 and the first strobing delay information SD1. The first data transmission delay period may be set as a period that is obtained by summing the first strobe transmission delay period and the first strobing delay period.

The first data reception delay information generation circuit 227a may generate the first data reception delay information DRD1, set as information on the first data reception delay period, based on the first strobe reception delay information SRD1 and the first strobing delay information SD1. The first data reception delay period may be set as a period that is obtained by summing the first strobe reception delay period and the first strobing delay period.

Figure 4:
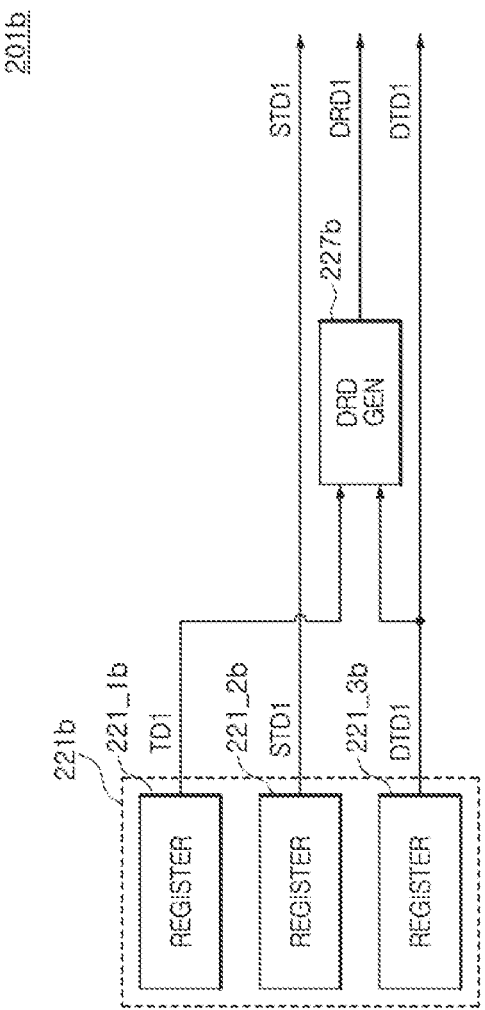
FIG. 4 is a block diagram illustrating a configuration of another embodiment of the first rank information generation circuit illustrated in FIG. 2.

FIG. 4 is a block diagram illustrating a configuration of another embodiment 201b of the first rank information generation circuit 201 illustrated in FIG. 2. As illustrated in FIG. 4, the first rank information generation circuit 201b may include a first rank information storage circuit 221b and a first data reception delay information generation circuit (DRD GEN) 227b.

The first rank information storage circuit 221*b* may include registers 221_1*b*, 221_2*b* and 221_3*b*. The register 221_1*b* may store and output a first transmission delay information TD1 in a write training. The register 221_2*b* may store and output the first strobe transmission delay information STD1 in the write training. The register 221_3*b* may store and output the first data transmission delay information DTD1 in the write training.

The first data reception delay information generation circuit 227*b* may generate the first data reception delay information DRD1, set as information on the first data reception delay period, based on the first transmission delay information TD1 and the first data transmission delay information DTD1. The first data reception delay period may be set as a period that is obtained by subtracting the first transmission delay period from the first data transmission delay period.

Figure 5:
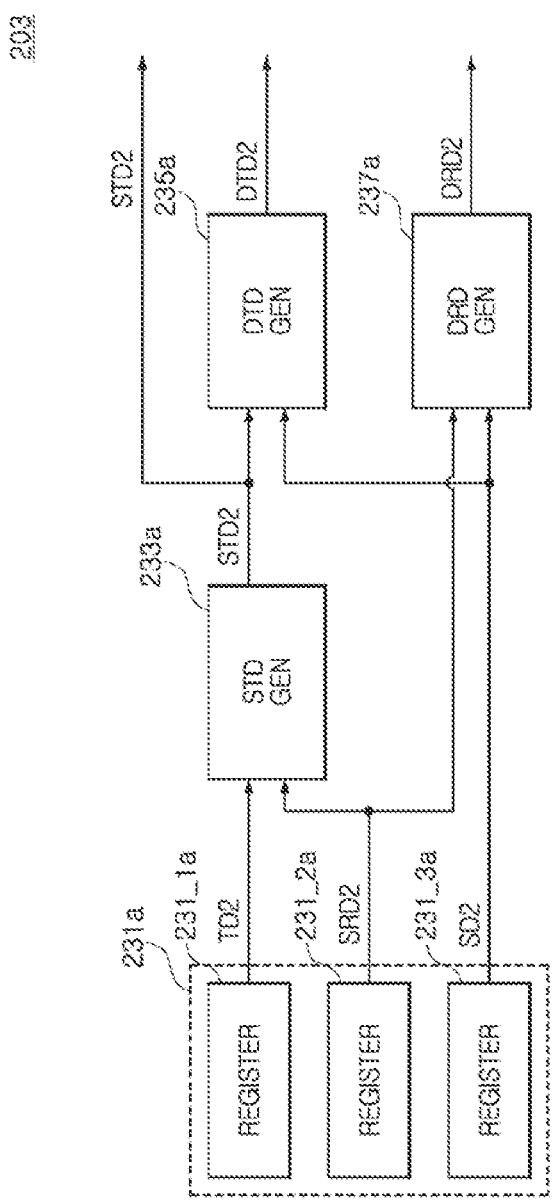
FIG. 5 is a block diagram illustrating a configuration of an embodiment of a second rank information generation circuit illustrated in FIG. 2.

FIG. 5 is a block diagram illustrating a configuration of an embodiment of the second rank information generation circuit 203 illustrated in FIG. 2. As illustrated in FIG. 5, the second rank information generation circuit 203 may include a second rank information storage circuit 231*a*, a second strobe transmission delay information generation circuit (STD GEN) 233*a*, a second data transmission delay information generation circuit (DTD GEN) 235*a* and a second data reception delay information generation circuit (DRD GEN) 237*a*, Since the operation of the second rank information generation circuit 203 illustrated in FIG. 5 is implemented in the same manner as the operation of the first rank information generation circuit 201*a* illustrated in FIG. 3, a detailed description thereof will be omitted herein.

FIG. 6 is a table for explaining delay periods set by information generated in the first rank information generation circuit 201*a* illustrated in FIG. 3 and the second rank information generation circuit 203 illustrated in FIG. 5.

As shown in FIG. 6, the first transmission delay information TD1, the first strobe reception delay information SRD1 and the first strobing delay information SD1 may be set as information on a first transmission delay period td11, a first strobe reception delay period td12 and a first strobing delay period td13, respectively. The first strobe transmission delay information STD1 may be set as information on a first strobe transmission delay period td11+td12 which is set as the sum of the first transmission delay period td11 and the first strobe reception delay period td12. The first data transmission delay information DTD1 may be set as information on a first data transmission delay period td11+td12+td13 which is set as the sum of the first strobe transmission delay period td11+td12 and the first strobing delay period td13. The first data reception delay information DRD1 may be set as information on a first data reception delay period td12+td13 which is set as the sum of the first strobe reception delay period td12 and the first strobing delay period td13.

As can be readily seen from the above description, a second transmission delay information TD2, a second strobe reception delay information SRD2, a second strobing delay information SD2, the second strobe transmission delay information STD2, the second data transmission delay information DTD2 and the second data reception delay information DRD2 may be set as information on a second transmission delay period td21, a second strobe reception delay period td22, a second strobing delay period td23, a second strobe transmission delay period td21+td22, a second data transmission delay period td21+td22+td23 and a second data reception delay period td22+td23, respectively.

Figure 7:
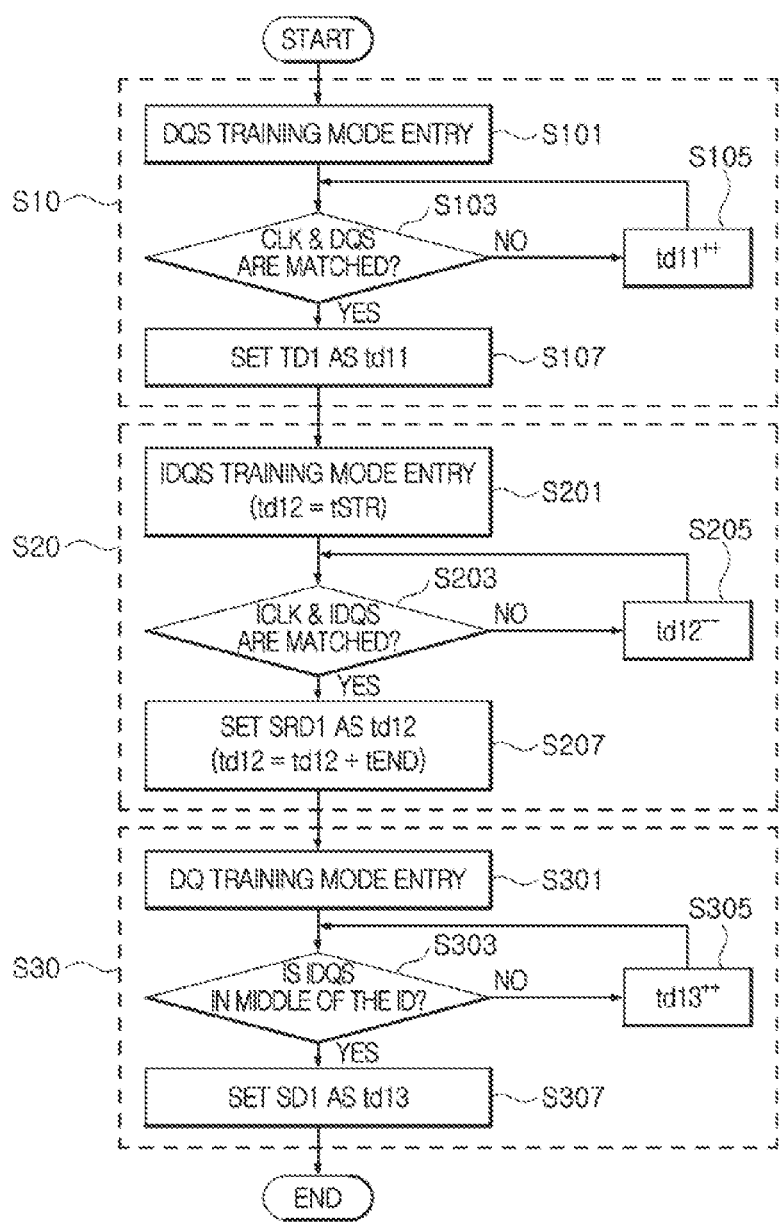
FIG. 7 is a flowchart for explaining operations in which information is set in a first rank information storage circuit illustrated in FIG. 3.

FIG. 7 is a flowchart for explaining operations in which the first electronic device 200 illustrated in FIG. 1 sets information in the first rank information storage circuit 221_*a*, illustrated in FIG. 3, through a write training. The first electronic device 200 may sequentially perform step S10 of performing an external write training mode to write-train the first rank 400, step S20 of performing a first internal write training mode and step S30 of performing a second internal write training mode. The first electronic device 200 may write-train the second rank 500 in the same manner as described above.

The step S10 of performing an external write training mode may include step S101 of entering an external write training mode, step S103 of comparing phases of the clock CLK and the strobe signal DQS, step S105 of adjusting the first transmission delay period td11 and step S107 of setting the first transmission delay information TD1. The first electronic device 200 may enter the external write training mode by initializing the first transmission delay period td11 (S101). The first electronic device 200 may compare phases of the clock CLK and the strobe signal DQS. In more detail, the first electronic device 200 may determine whether the clock CLK and the strobe signal DQS are simultaneously input to the first rank 400 with respect to a reference time point (S103), The first electronic device 200 may delay the strobe signal DQS by increasing the first transmission delay period td11 (S105). The first electronic device 200 may repeatedly perform the steps S103 and S105 until the clock CLK and the strobe signal DQS are simultaneously input to the first rank 400. When the clock CLK and the strobe signal DQS are simultaneously input to the first rank 400, the first electronic device 200 may set the first transmission delay information TD1 as the first transmission delay period td11 (S107).

The step S20 of performing a first internal write training mode may include step S201 of entering a first internal write training mode, step S203 of comparing phases of the internal dock ICLK1 (see FIG. 10) and the internal strobe signal IDQS1 (see FIG. 10), step S205 of adjusting the first strobe reception delay period td12 and step S207 of setting the first strobe reception delay information SRD1. The first electronic device 200 may enter the first internal write training mode by applying a training entry delay period tSTR to the first strobe reception delay period td12 (S201). The training entry delay period tSTR may be variously set depending on an embodiment. The first electronic device 200 may compare phases of the internal clock ICLK1 and the internal strobe signal IDQS1 (S203), The first electronic device 200 may adjust a delay amount of the internal strobe signal IDQS1 by decreasing the first strobe reception delay period td12 (S205). According to an embodiment, at the step S205, the first electronic device 200 may efficiently adjust a delay amount of the internal strobe signal IDQS1 by increasing the first strobe reception delay period td12 by a larger delay unit and then decreasing the first strobe reception delay period td12 by a smaller delay unit. The first electronic device 200 may repeatedly perform the steps S203 and S205 until phases of the internal clock ICLK1 and the internal strobe signal IDQS1 satisfy a preset condition in consideration of the training entry delay period tSTR. When phases of the internal dock ICLK1 and the internal strobe signal IDQS1 satisfy the preset condition, the first electronic device 200 may apply a training end delay period tEND to the first strobe reception delay period td12, The training end delay period tEND may be variously set depending on an embodiment. The first electronic device 200 may set the first strobe reception delay information SRD1 as the first strobe reception delay period td12 (S207).

The step S30 of performing a second internal write training mode may include step S301 of entering a second internal write training mode, step S303 of comparing phases of the internal data ID1 (see FIG. 10) and the internal strobe signal IDQS1 (see FIG. 10), step S305 of adjusting the first strobing delay period td13 and step S307 of setting the first strobing delay information SD1, The first electronic device 200 may enter the second internal write training mode by initializing the first strobing delay period td13 (S301). The first electronic device 200 may compare phases of the internal data ID1 and the internal strobe signal IDQS1. In more detail, the first electronic device 200 may determine whether the middle of the internal data ID1 is positioned at a rising (falling) edge of the internal strobe signal IDQS1 (S303). The first electronic device 200 may delay the internal data ID1 by increasing the first strobing delay period td13 (S305), The first electronic device 200 may repeatedly perform the steps S303 and S305 until the middle of the internal data ID1 is positioned at a rising (falling) edge of the internal strobe signal IDQS. When the middle of the internal data ID1 is positioned at a rising (falling) edge of the internal strobe signal IDQS, the first electronic device 200 may set the first strobing delay information SD1 as the first strobing delay period td13 (S307).

FIG. 8 is a table for explaining operations of setting offset information in the first offset information generation circuit 209 and the second offset information generation circuit 211 illustrated in FIG. 2.

Referring to FIG. 8, the first data reception delay information DRD1 may be set as information on the first data reception delay period td12+td13. The first entry offset information ODT_ON1 may be set as information on the entry offset period of the first rank 400 (see FIG. 1) and the non-target entry offset period of the second rank 500 (see FIG. 1). When the first data reception delay period td12+td13 is equal to or larger than 0 tCK and smaller than 0.05 tCK, the first entry offset information generation circuit 209_1 may set the first entry offset information ODT_ON1 to 2 tCK ('tCK' indicates one cycle of the clock CLK). When the first data reception delay period td12+td13 is equal to or larger than 0.05 tCK and smaller than 1.05 tCK, the first entry offset information generation circuit 209_1 may set the first entry offset information ODT_ON1 to 1 tCK, When the first data reception delay period td12+td13 is equal to or larger than 1.05 tCK and smaller than 2.05 tCK, the first entry offset information generation circuit 209_1 may set the first entry offset information ODT_ON1 to 0 tCK.

The first end offset information ODT_OFF1 may be set as information on the end offset period of the first rank 400 (see FIG. 1) and the non-target end offset period of the second rank 500 (see FIG. 1). When the first data reception delay period td12+td13 is equal to or larger than 0 tCK and smaller than 0.45 tCK, the first end offset information generation circuit 209_2 may set the first end offset information ODT_OFF1 to 0 tCK. When the first data reception delay period td12+td13 is equal to or larger than 0.45 tCK and smaller than 1.45 tCK, the first end offset information generation circuit 209_2 may set the first end offset information ODT_OFF1 to 1 tCK. When the first data reception delay period td12+td13 is equal to or larger than 1.45 tCK and smaller than 2.45 tCK, the first end offset information generation circuit 209_2 may set the first end offset information ODT_OFF1 to 2 tCK, A detailed description of the operation of the second offset information generation circuit 211 will be omitted herein.

Figure 9:
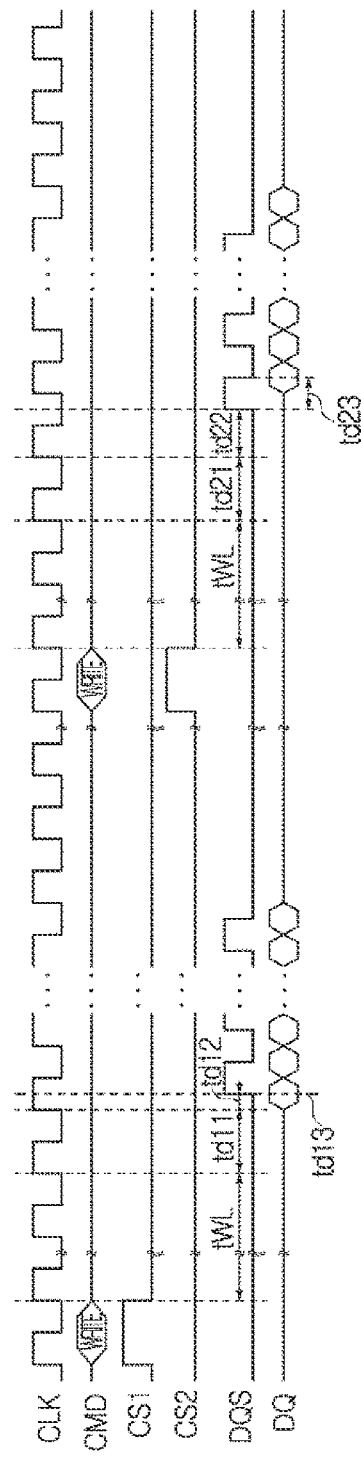
FIG. 9 is a timing diagram for explaining operations in which signals for an inter-rank write operation are transmitted from the first electronic device illustrated in FIG. 1.

FIG. 9 is a timing diagram for explaining timings at which the first electronic device 200 illustrated in FIG. 1 transmits the strobe signal DQS and the data DQ for an inter-rank write operation.

The first electronic device 200 transmits the command CMD and the first chip select signal CS1 for performing a write operation in the first rank 400, to the second electronic device 300. The first electronic device 200 transmits the strobe signal DQS later than a time point when a write latency tWL elapses, by a duration amount of the first strobe transmission delay period td11+td12 set to 1.25 tCK. The first transmission delay period td11 and the first strobe reception delay period td12 are set to 1 tCK and 0.25 tCK, respectively. The first electronic device 200 transmits the data DQ together with the strobe signal DQS. Namely, the first strobing delay period td13 is set to 0 tCK.

The first electronic device 200 transmits the command CMD and the second chip select signal CS2 for performing a write operation in the second rank 500, to the second electronic device 300. The first electronic device 200 transmits the strobe signal DQS later than a time point when the write latency tWL elapses, by a duration amount of the second strobe transmission delay period td21+td22 set to 1.75 tCK. The second transmission delay period td21 and the second strobe reception delay period td22 are set to 1 tCK and 0.75 tCK, respectively. The first electronic device 200 transmits the data DQ later than a time point when the strobe signal DQS is transmitted, by a duration amount of the second strobing delay period td23 set to 0.5 tCK.

Figure 10:
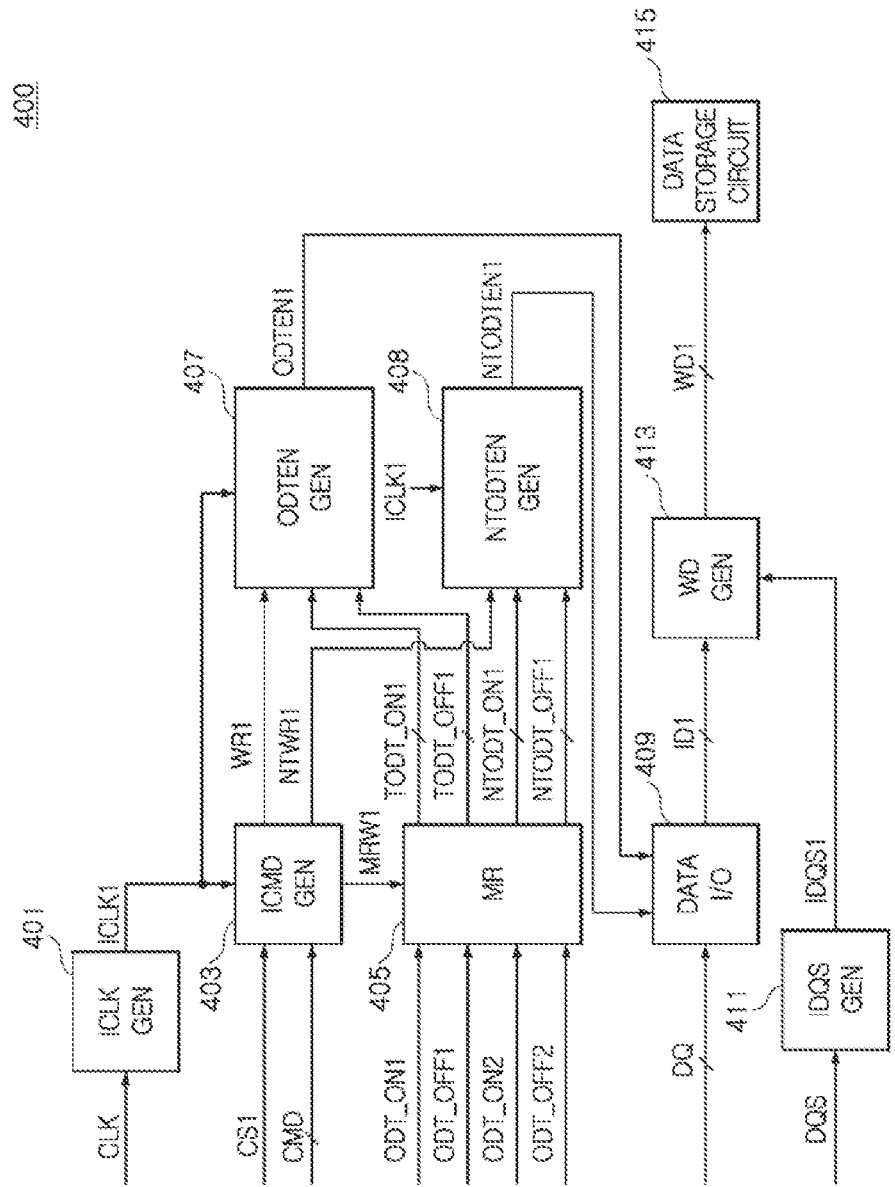
FIG. 10 is a block diagram illustrating a configuration of an embodiment of a first rank illustrated in FIG. 1.

FIG. 10 is a block diagram illustrating a configuration of an embodiment of the first rank 400 illustrated in FIG. 1. As illustrated in FIG. 10, the first rank 400 may include an internal clock generation circuit (ICLK GEN) 401, an internal command generation circuit (ICMD GEN) 403, a mode register (MR) 405, an enable signal generation circuit (ODTEN GEN) 407, a non-target enable signal generation circuit (NTODTEN GEN) 408, a data input and output circuit (DATA I/O) 409, an internal strobe signal generation circuit (IDQS GEN) 411, a write data generation circuit (WD GEN) 413 and a data storage circuit (DATA STORAGE CIRCUIT) 415.

The internal clock generation circuit 401 may generate the internal clock ICLK1 by receiving the clock CLK.

The internal command generation circuit 403 may generate a write command WR1, a non-target write command NTWR1 and a mode register write command MRW1 based on the first chip select signal CS1 and the command CMD in synchronization with the internal clock ICLK1. The internal command generation circuit 403 may generate the write command WR1 from the command CMD for a write operation, when the first chip select signal CS1 is activated. The internal command generation circuit 403 may generate the non-target write command MTWR1 from the command CMD for a write operation, when the first chip select signal CS1 is deactivated. The internal command generation circuit 403 may generate the mode register write command MRW1 from the command CMD for a mode register write operation, when the first chip select signal CS1 is activated.

When the mode register write operation is performed based on the mode register write command MRW1, the mode register 405 may store and output the first entry offset information ODT_ON1 and the first end offset information ODT_OFF1 as an entry offset code TODT_ON1 and an end offset code TODT_OFF1, respectively. The first entry offset information ODT_ON1 and the first end offset information ODT_OFF1 may be generated based on information on the first data reception delay period of the first rank 400. The entry offset code TODT_ON1 may be generated to set the entry offset period. The end offset code TODT_OFF1 may be generated to set the end offset period. When the mode register write operation is performed based on the mode register write command MRW1, the mode register 405 may store and output the second entry offset information ODT_ON2 and the second end offset information ODT_OFF2 as a non-target entry offset code NTODT_ON1 and a non-target end offset code NTODT_OFF1, respectively. The second entry offset information ODT_ON2 and the second end offset information ODT_OFF2 may be generated based on information on the second data reception delay period of the second rank 500 (see FIG. 1), The non-target entry offset code NTODT_ON1 may be generated to set the non-target entry offset period. The non-target end offset code NTODT_OFF1 may be generated to set the non-target end offset period.

The enable signal generation circuit 407 may generate a termination enable signal ODTEN1 from the write command WR1 based on the entry offset code TODT_ON1 and the end offset code TODT_OFF1 in synchronization with the internal clock ICLK1. The enable signal generation circuit 407 may activate the termination enable signal ODTEN1 earlier by the entry offset period than a time point when the write latency elapses, based on the entry offset code TODT_ON1, The entry offset period may be adjusted depending on the first data reception delay period. In more detail, the entry offset period may decrease as the first data reception delay period increases. The enable signal generation circuit 407 may deactivate the termination enable signal ODTEN1 later than a time point when the write latency and the burst length period elapse, by a duration amount of the end offset period, based on the end offset code TODT_OFF1. The end offset period may be adjusted depending on the first data reception delay period. In more detail, the end offset period may increase as the first data reception delay period increases. The detailed configuration and operation of the enable signal generation circuit 407 will be described later with reference to FIG. 11.

The non-target enable signal generation circuit 408 may generate a non-target termination enable signal NTODTEN1 from the non-target write command NTWR1 based on the non-target entry offset code NTODT_ON1 and the non-target end offset code NTODT_OFF1 in synchronization with the internal clock ICLK1. The non-target enable signal generation circuit 408 may activate the non-target termination enable signal NTODTEN1 earlier by the non-target entry offset period than a time point when the write latency elapses, based on the non-target entry offset code NTODT_ON1. The non-target entry offset period may be adjusted depending on the second data reception delay period. In more detail, the non-target entry offset period may decrease as the second data reception delay period increases. The non-target enable signal generation circuit 408 may deactivate the non-target termination enable signal NTODTEN1 later than a time point when the write latency and the burst length period elapse, by a duration amount of the non-target end offset period, based on the non-target end offset code NTODT_OFF1. The non-target end offset period may be adjusted depending on the second data reception delay period. In more detail, the non-target end offset period may increase as the second data reception delay period increases.

The data input and output circuit 409 may include the first termination resistor RTT_R1. The data input and output circuit 409 may set a value of the first termination resistor RTT_R1 to one of the first resistance value R1 PARK, the second resistance value RTT_WR and the third resistance value RTT_NOM based on the termination enable signal ODTEN1 and the non-target termination enable signal NTODTEN1. When the write operation is performed, the data input and output circuit 409 may receive the data DQ later than a time point when the write latency elapses, by a duration amount of the first data reception delay period, based on the termination enable signal ODTEN1, and may output the received data DQ as the internal data ID1. When the termination enable signal ODTEN1 is activated in the write operation, the data input and output circuit 409 may adjust a value of the first termination resistor RTT_R1 from the first resistance value RTT_PARK to the second resistance value RTT_WR. When the termination enable signal ODTEN1 is deactivated in the write operation, the data input and output circuit 409 may adjust a value of the first termination resistor RTT_R1 from the second resistance value RTT_WR to the first resistance value RTT_PARK. The data input and output circuit 409 may block the reception of the data DQ input later than a time point when the write latency elapses, by a duration amount of the second data reception delay period, based on the non-target termination enable signal NTODTEN1. When the non-target termination enable signal NTODTEN1 is activated, the data input and output circuit 409 may adjust a value of the first termination resistor RTT_R1 from the first resistance value RTT_PARK to the third resistance value RTT_NOM. When the non-target termination enable signal NTODTEN1 is deactivated, the data input and output circuit 409 may adjust a value of the first termination resistor RTT_R1 from the third resistance value RTT_NOM to the first resistance value RTT_PARK.

When the write operation is performed, the internal strobe signal generation circuit 411 may generate the internal strobe signal IDQS1 by receiving the strobe signal DQS later than a time point when the write latency elapses, by a duration amount of the first strobe reception delay period.

The write data generation circuit 413 may output the internal data ID1 as write data WD1 in synchronization with the internal strobe signal IDQS1 after the first strobing delay period elapses from a time point when the internal strobe signal IDQS1 is received.

When the write operation is performed, the data storage circuit 415 may receive and store the write data WD1.

Figure 11:
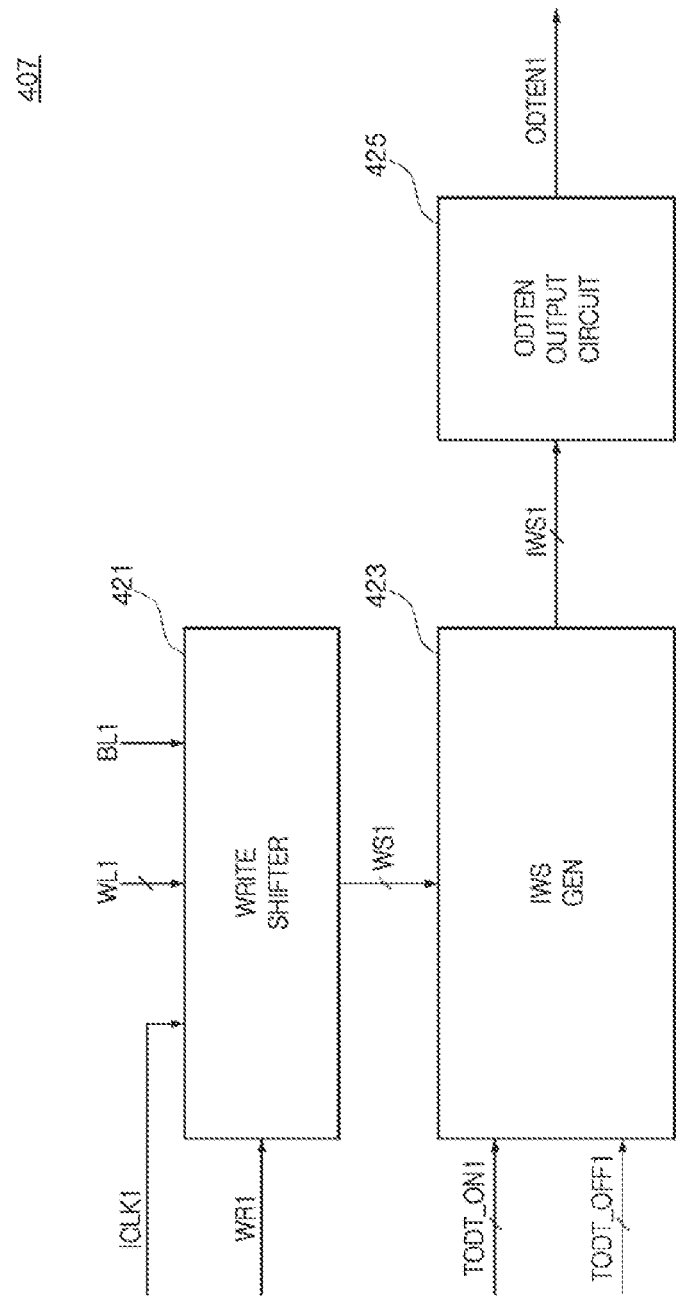
FIG. 11 is a block diagram illustrating a configuration of an embodiment of an enable signal generation circuit illustrated in FIG. 10.

FIG. 11 is a block diagram illustrating a configuration of an embodiment of the enable signal generation circuit 407 illustrated in FIG. 10. As illustrated in FIG. 11, the enable signal generation circuit 407 may include a write shift circuit (WRITE SHIFTER) 421, an internal write shift signal generation circuit (IWS GEN) 423 and an enable signal output circuit (ODTEN OUTPUT CIRCUIT) 425.

The write shift circuit 421 may generate a write shift signal WS1 from the write command WR1 based on a write latency signal WL1 and a burst length signal BL1 in synchronization with the internal clock ICLK1. The write latency signal WL1 may include bits which are set as information on the write latency, According to an embodiment, the write latency signal WL1 may be stored in and output from the mode register 405 (see FIG. 10). The burst length signal BL1 may include information on a burst length of the data DQ (see FIG. 10). For example, a logic level of the burst length signal BL1 may indicate a burst length of the data DQ. According to an embodiment, the burst length signal BL1 may be stored in and output from the mode register 405 or may be applied from the first electronic device 200 (see FIG. 1). The write shift circuit 421 may be implemented by a plurality of flip-flops (not illustrated) which shift the write command WR1 by the unit of one cycle of the internal dock ICLK1 during the write latency and a burst length period. The write shift circuit 421 may output signals which are shifted by the plurality of flip-flops, as a plurality of write shift signals WS1.

The internal write shift signal generation circuit 423 may output the write shift signal WS1 as an internal write shift signal IWS1 based on the entry offset code TODT_ON1 and the end offset code TODT_OFF1. The internal write shift signal generation circuit 423 may control the output of the internal write shift signal IWS1 to set the entry offset period based on the entry offset code TODT_ON1. The internal write shift signal generation circuit 423 may control the output of the internal write shift signal IWS1 to set the end offset period based on the end offset code TODT_OFF1. The internal write shift signal generation circuit 423 may be implemented by a switching circuit (not illustrated).

The enable signal output circuit 425 may output the termination enable signal ODTEN1 by synthesizing a plurality of internal write shift signals IWS1. The enable signal output circuit 425 may activate the termination enable signal ODTEN1 when at least one of the plurality of internal write shift signals IWS1 is activated.

Figure 12:
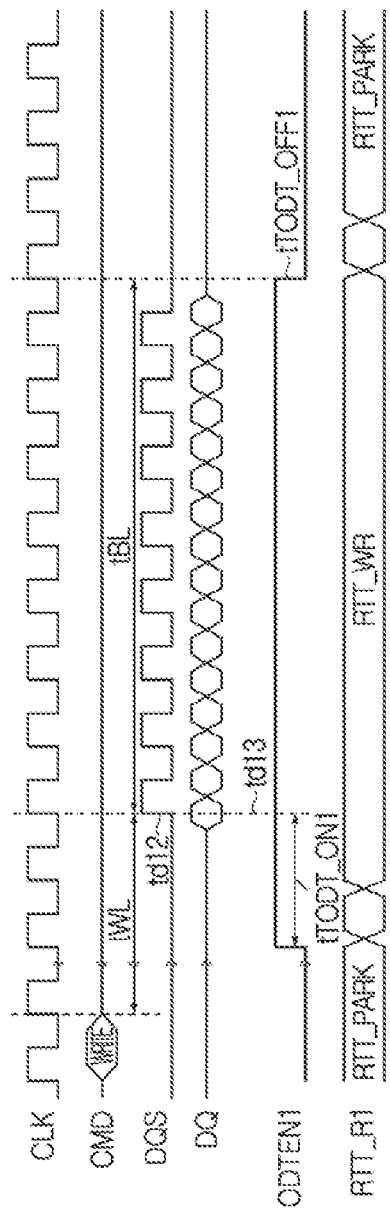
FIGS. 12, 13, and 14 are timing diagrams for explaining a write operation performed in the first rank illustrated in FIG. 10.
Figure 13:
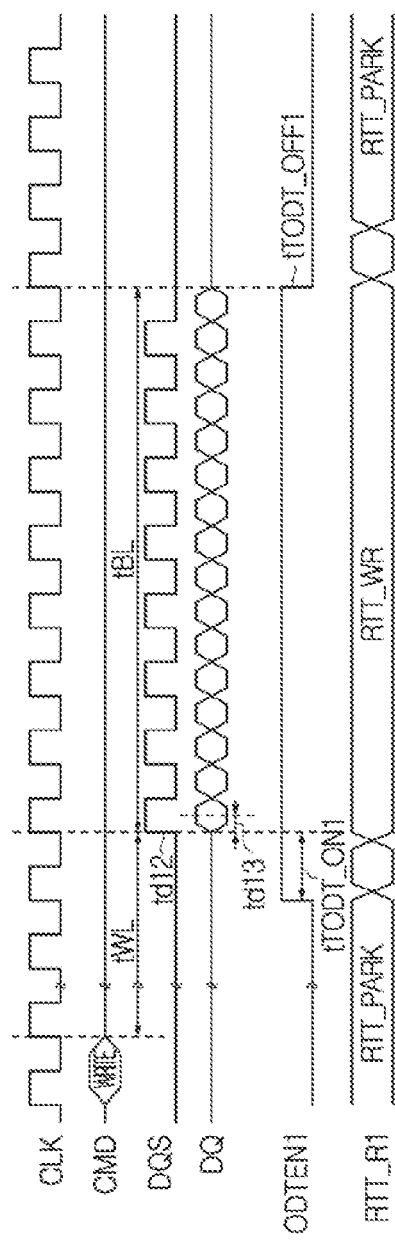
Figure 14:
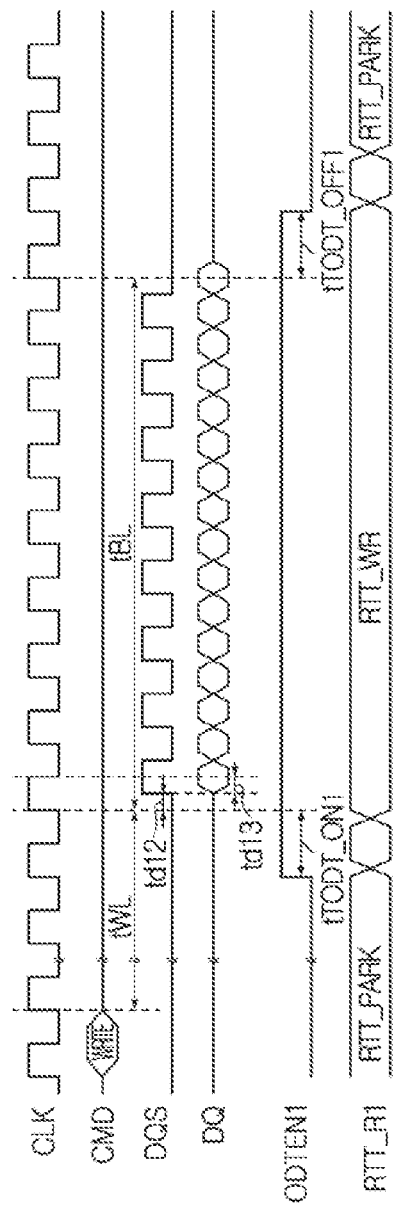

FIGS. 12, 13 and 14 are timing diagrams for explaining a termination operation period that varies depending on a period by which the reception of the data DQ is delayed when a write operation is performed in the first rank 400 illustrated in FIG. 10.

In the case of FIG. 12, when performing a write operation, the first rank 400 receives the strobe signal DQS and the data DQ at a time point when the write latency tWL elapses. That is to say, the first data reception delay period td12+td13 of the first rank 400 may be set to 0 tCK. Referring to FIG. 8, it may be seen that, when the first data reception delay period td12+td13 is set to 0 tCK, an entry offset period tTODT_ON1 and an end offset period tTODT_OFF1 are set to 2 tCK and 0 tCK, respectively. Accordingly, the first rank 400 may activate the termination enable signal ODTEN1 earlier than the time point when the write latency tWL elapses by a duration amount of the entry offset period tTODT_ON1. When the termination enable signal ODTEN1 is activated, the first rank 400 may adjust a value of the first termination resistor RTT_R1 from the first resistance value RTT_PARK to the second resistance value RTT_WR. The first rank 400 may deactivate the termination enable signal ODTEN1 at a time point when the write latency tWL and a burst length period tBL elapse. When the termination enable signal ODTEN1 is deactivated, the first rank 400 may adjust a value of the first termination resistor RTT_R1 from the second resistance value RTT_WR to the first resistance value RTT_PARK.

In the case of FIG. 13, when performing a write operation, the first rank 400 receives the strobe signal DQS at a time point when the write latency tWL elapses. That is to say, the first strobe reception delay period td12 of the first rank 400 may be set to 0 tCK. The first rank 400 receives the data DQ later than the time point when the strobe signal DQS is received, by a duration amount of the first strobing delay period td13 set to 0.25 tCK. Referring to FIG. 8, it may be seen that, when the first data reception delay period td12+td13 is set to 0.25 tCK, the entry offset period tTODT_ON1 and the end offset period tTODT_OFF1 are set to 1 tCK and 0 tCK, respectively. Accordingly, the first rank 400 may adjust a value of the first termination resistor RTT_R1 by activating the termination enable signal ODTEN1 earlier by the entry offset period tTODT_ON1 set to 1 tCK than the time point when the write latency tWL elapses.

In the case of FIG. 14, when performing a write operation, the first rank 400 receives the strobe signal DQS later than a time point when the write latency tWL elapses, by a duration amount of the first strobe reception delay period td12 set to 0.25 tCK. The first rank 400 receives the data DQ later than the time point when the strobe signal DQS is received, by a duration amount of the first strobing delay period td13 set to 0.25 tCK. Referring to FIG. 8, it may be seen that, when the first data reception delay period td12+td13 is set to 0.5 tCK, the entry offset period tTODT_ON1 and the end offset period tTODT_OFF1 are set to 1 tCK and 1 tCK, respectively. Accordingly, the first rank 400 may adjust a value of the first termination resistor RTT_R1 by deactivating the termination enable signal ODTEN1 later than a time point when the write latency tWL and the burst length period tBL elapse, by a duration amount of the end offset period tTODT_OFF1 set to 1 tCK.

As is apparent from the above description, according to the present disclosure, by adjusting an offset period that determines an entry (end) time point of a termination operation, depending on a period by which data reception is delayed from a reference time point in a write operation, it is possible to optimize a period in which the termination operation is performed.

Figure 15:
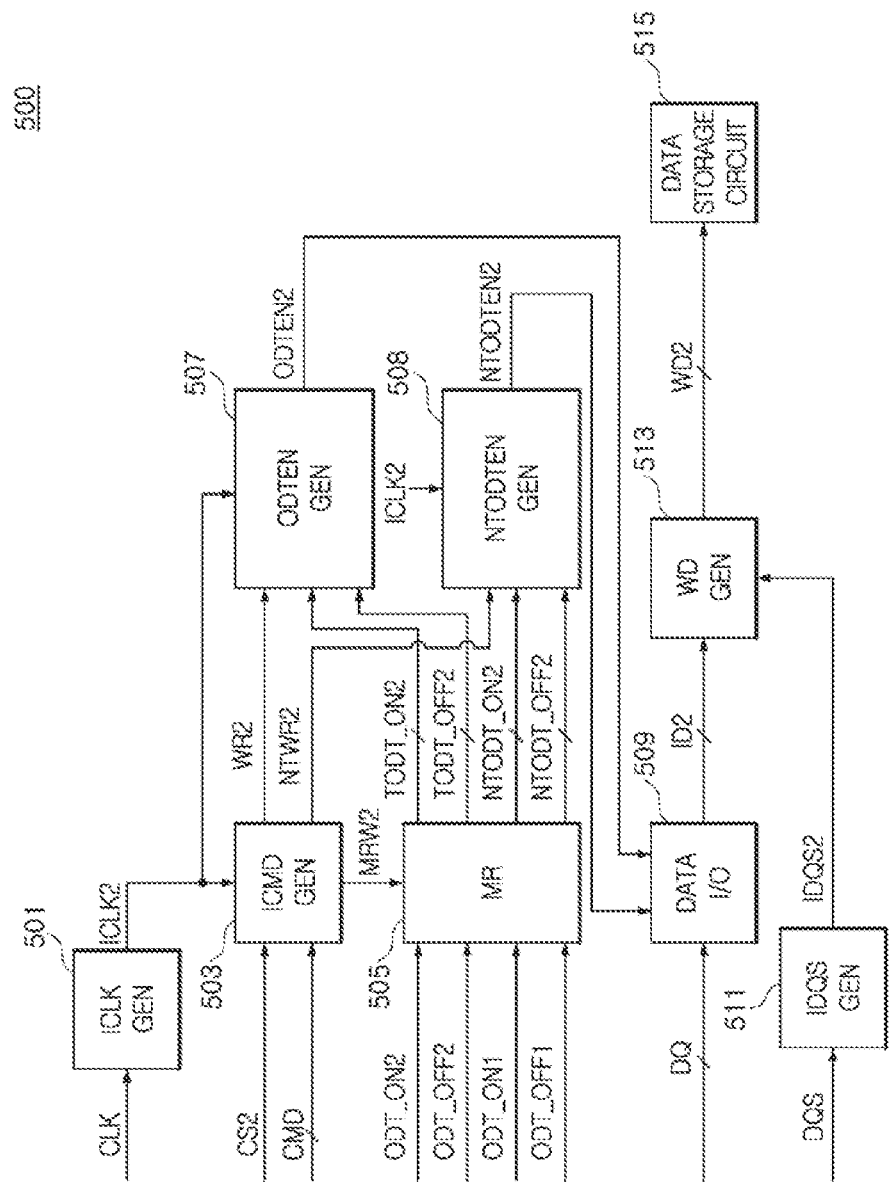
FIG. 15 is a block diagram illustrating a configuration of an embodiment of a second rank illustrated in FIG. 1.

FIG. 15 is a block diagram illustrating a configuration of an embodiment of the second rank 500 illustrated in FIG. 1. As illustrated in FIG. 15, the second rank 500 may include an internal clock generation circuit (ICLK GEN) 501, an internal command generation circuit (ICMD GEN) 503, a mode register (MR) 505, an enable signal generation circuit (ODTEN GEN) 507, a non-target enable signal generation circuit (NTODTEN GEN) 508, a data input and output circuit (DATA I/O) 509, an internal strobe signal generation circuit (IDQS GEN) 511, a write data generation circuit (WD GEN) 513 and a data storage circuit (DATA STORAGE CIRCUIT) 515.

The internal command generation circuit 503 may generate a write command WR2, a non-target write command NTWR2 and a mode register write command MRW2 based on the second chip select signal CS2.

The mode register 505 may store the second entry offset information ODT_ON2 and the second end offset information ODT_OFF2 as an entry offset code TODT_ON2 and an end offset code TODT_OFF2, respectively, based on the mode register write command MRW2, The entry offset code TODT_ON2 may be generated to set the entry offset period. The end offset code TODT_OFF2 may be generated to set the end offset period. The mode register 505 may store the first entry offset information ODT_ON1 and the first end offset information ODT_OFF1 as a non-target entry offset code NTODT_ON2 and a non-target end offset code NTODT_OFF2, respectively, based on the mode register write command MRW2. The non-target entry offset code NTODT_ON2 may be generated to set the non-target entry offset period. The non-target end offset code NTODT_OFF2 may be generated to set the non-target end offset period.

The data input and output circuit 509 may include the second termination resistor RTT_R.

Figure 16:
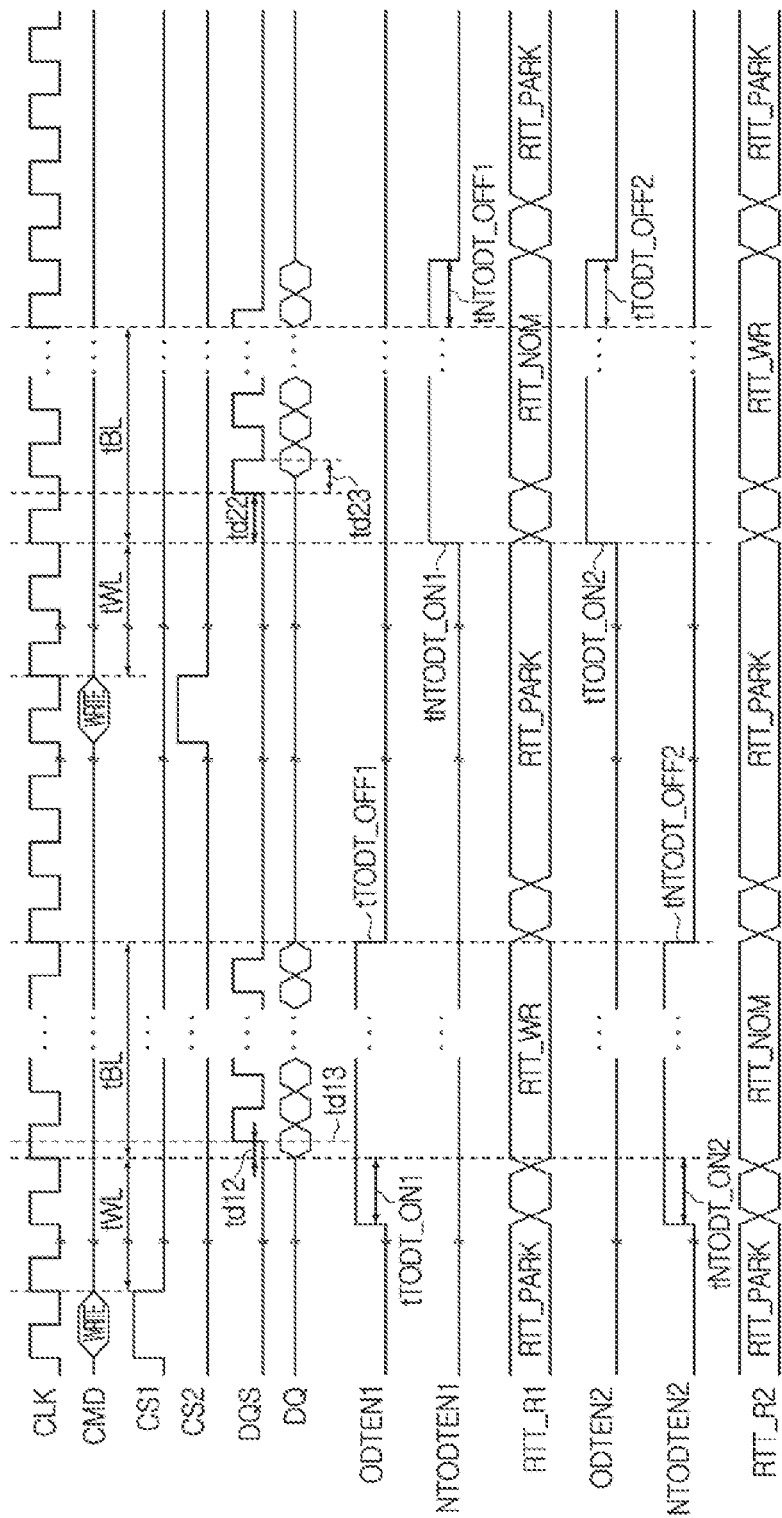
FIG. 16 is a timing diagram for explaining an inter-rank write operation performed in a second electronic device illustrated in FIG. 1.

FIG. 16 is a timing diagram for explaining a write operation alternately performed in the first rank 400 and the second rank 500 illustrated in FIG. 1, As illustrated in FIG. 16, the first rank 400 and the second rank 500 are sequentially set as a target rank.

An operation when the first rank 400 is a target rank is as follows. The first rank 400 receives the data DQ later than a time point when the write latency tWL elapses, by a duration amount of the first data reception delay period td12+td13 set to 0.25 tCK. Referring to FIGS. 8 and 16, it may be seen that, when the first data reception delay period td12+td13 is set to 0.25 tCK, both the entry offset period tTODT_ON1 and the non-target entry offset period tNTODT_ON2 are set to 1 tCK and both the end offset period tTODT_OFF1 and the non-target end offset period tNTODT_OFF2 are set to 0 tCK. An operation when the second rank 500 is a target rank is as follows. The second rank 500 receives the data DQ later than a time point when the write latency tWL elapses, by a duration amount of the second data reception delay period td22+td23 set to 1.25 tCK. Referring to FIGS. 8 and 16, it may be seen that, when the second data reception delay period td22+td23 is set to 1.25 tCK, both the entry offset period tTODT_ON2 and the non-target entry offset period tNTODT_ON1 are set to 0 tCK and both the end offset period tTODT_OFF2 and the non-target end offset period tNTODT_OFF1 are set to 1 tCK. Accordingly, the first rank 400 and the second rank 500 may adjust values of the first termination resistor RTT_R1 and the second termination resistor RTT_R2, respectively, during termination operation periods that are set to be the same.

As is apparent from the above description, according to the present disclosure, by setting an offset period of a non-target rank depending on a data reception delay period of a target rank performing a write operation, it may be possible to optimize a period in which a termination operation is performed in a write operation alternately performed between ranks.

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An electronic device comprising:
   an enable signal generation circuit configured to activate, when a write operation is performed, a termination enable signal earlier than a time point when a write latency elapses, by a duration amount of an entry offset period; and
   a data input and output circuit configured to receive, when the write operation is performed, data later than the time point when the write latency elapses, based on the termination enable signal, by a duration amount of a first data reception delay period,
   wherein the entry offset period is adjusted depending on the first data reception delay period.

2. The electronic device according to claim 1, further comprising:
   an internal strobe signal generation circuit configured to generate an internal strobe signal by receiving a strobe signal later than the time point when the write latency elapses, by a duration amount of a strobe reception delay period; and
   a write data generation circuit configured to output internal data as write data in synchronization with the internal strobe signal after a strobing delay period elapses from a time point when the internal strobe signal is received,
   wherein the internal data is generated from the data in the data input and output circuit, and the first data reception delay period is set as a period that is obtained by summing the strobe reception delay period and the strobing delay period.

3. The electronic device according to claim 1, wherein the enable signal generation circuit decreases the entry offset period as the first data reception delay period increases.

4. The electronic device according to claim 1, wherein the data input and output circuit includes a termination resistor, and adjusts a value of the termination resistor from a first resistance value to a second resistance value when the termination enable signal is activated in the write operation.

5. The electronic device according to claim 1, wherein, when the write operation is performed, the enable signal generation circuit deactivates the termination enable signal later than a time point when the write latency and a burst length period elapse, by a duration amount of an end offset period, and the end offset period increases as the first data reception delay period increases.

6. The electronic device according to claim 5, wherein, when the termination enable signal is deactivated, the data input and output circuit adjusts a value of the termination resistor from the second resistance value to the first resistance value.

7. The electronic device according to claim 1, further comprising:
   a non-target enable signal generation circuit configured to activate, when a non-target write command is activated, a non-target termination enable signal earlier than the time point when the write latency elapses, by a duration amount of a non-target entry offset period,
   wherein, when the non-target termination enable signal is activated, the data input and output circuit blocks reception of the data input later than the time point when the write latency elapses, by a duration amount of a second data reception delay period, and
   wherein the non-target entry offset period decreases as the second data reception delay period increases.

8. The electronic device according to claim 7, further comprising:
   an internal command generation circuit configured to generate, when a chip select signal is deactivated, the non-target write command from a command for the write operation.

9. The electronic device according to claim 7, wherein, when the non-target termination enable signal is activated, the data input and output circuit adjusts a value of the termination resistor from the first resistance value to a third resistance value.

10. The electronic device according to claim 7, wherein, when the non-target write command is activated, the non-target enable signal generation circuit deactivates the non-target termination enable signal later than the time point when the write latency and the burst length period elapse, by a duration amount of non-target end offset period, and the non-target end offset period increases as the second data reception delay period increases.

11. The electronic device according to claim 10, wherein, when the non-target termination enable signal is deactivated, the data input and output circuit adjusts a value of the termination resistor from the third resistance value to the first resistance value.

12. An electronic device comprising:
    a first rank including a first termination resistor, and configured to, when performing a write operation, receive data later than a time point when a write latency elapses, by a duration amount of a first data reception delay period; and
    a second rank including a second termination resistor, and configured to, when the first rank performs the write operation, adjust a value of the second termination resistor earlier than the time point when the write latency elapses, by a duration amount of a non-target entry offset period, wherein the non-target entry offset period is adjusted depending on the first data reception delay period.

13. The electronic device according to claim 12, wherein the first rank performs the write operation based on a first chip select signal and a command for the write operation, the second rank performs the write operation based on a second chip select signal and the command for the write operation, and the first and second chip select signals are selectively activated.

14. The electronic device according to claim 12, wherein the first rank further includes:

an internal strobe signal generation circuit configured to generate an internal strobe signal by receiving a strobe signal later than the time point when the write latency elapses, by a duration amount of a strobe reception delay period; and a write data generation circuit configured to output internal data as write data in synchronization with the internal strobe signal after a strobing delay period elapses from a time point when the internal strobe signal is received, wherein the internal data is generated from the data, and the first data reception delay period is set as a period that is obtained by summing the strobe reception delay period and the strobing delay period.

15. The electronic device according to claim 12, wherein, when the write operation is performed, the second rank receives the data later than the time point when the write latency elapses, by a duration amount of a second data reception delay period.

16. The electronic device according to claim 12, wherein the first rank adjusts a value of the first termination resistor from a first resistance value to a second resistance value earlier than the time point when the write latency elapses, by a duration amount of an entry offset period, and the entry offset period decreases as the first data reception delay period increases.

17. The electronic device according to claim 16, wherein, when the first rank performs the write operation, the second rank adjusts a value of the second termination resistor from the first resistance value to a third resistance value earlier than the time point when the write latency elapses, by a duration amount of the non-target entry offset period, and the non-target entry offset period is set to be the same as the entry offset period.

18. The electronic device according to claim 16, wherein, when performing the write operation, the first rank adjusts a value of the first termination resistor from the second resistance value to the first resistance value later than a time point when the write latency and a burst length period elapse, by a duration amount of an end offset period, and the end offset period increases as the first data reception delay period increases.

19. The electronic device according to claim 18, wherein, when the first rank performs the write operation, the second rank adjusts a value of the second termination resistor from the third resistance value to the first resistance value later than the time point when the write latency and the burst length period elapse, by a duration amount of a non-target end offset period, and the non-target end offset period is set to be the same as the end offset period.

20. An electronic system comprising:

a controller configured to transmit a command for a write operation, data and an offset information; and a memory device including first and second ranks which receive the command, the data and the offset information, each of the first and second ranks being set as one of a target rank which performs the write operation and a non-target rank, wherein the controller adjusts a time point when the data is transmitted, depending on which one of the first and second ranks is the target rank, wherein the memory device sets periods by which values of a termination resistor of the target rank and a termination resistor of the non-target rank are adjusted, to be the same, based on the offset information, and wherein the offset information is generated based on information on a time point when the target rank receives the data.

* * * * *